United States Patent
Liu et al.

(10) Patent No.: US 6,608,283 B2
(45) Date of Patent: Aug. 19, 2003

(54) APPARATUS AND METHOD FOR SOLDER-SEALING AN ACTIVE MATRIX ORGANIC LIGHT EMITTING DIODE

(75) Inventors: Yachin Liu, Poughkeepsie, NY (US); Amalkumar P. Ghosh, Poughkeepsie, NY (US); Steven M. Zimmerman, Pleasant Valley, NY (US); Christian M. Heller, Albany, NY (US)

(73) Assignee: eMagin Corporation, Hopewell Junction, NY (US)

( * ) Notice: Subject to any disclaimer, the term of this patent is extended or adjusted under 35 U.S.C. 154(b) by 351 days.

(21) Appl. No.: 09/778,797

(22) Filed: Feb. 8, 2001

(65) Prior Publication Data

US 2001/0048234 A1 Dec. 6, 2001

Related U.S. Application Data

(60) Provisional application No. 60/181,070, filed on Feb. 8, 2000.

(51) Int. Cl.[7] .......................... B23K 26/00; B23K 1/00; B23K 35/14; H01L 21/52
(52) U.S. Cl. .................. 219/121.85; 228/245; 228/246
(58) Field of Search ........................ 219/121.85, 121.64, 219/85.13, 85.21; 228/124.6, 180.21, 180.22, 245, 246, 254; 257/737, 738

(56) References Cited

U.S. PATENT DOCUMENTS 4,400,870 A * 8/1983 Islam
4,685,200 A * 8/1987 Bokil
5,436,202 A * 7/1995 Miura
5,703,394 A * 12/1997 Wei et al.
6,011,304 A * 1/2000 Mertol
6,198,220 B1 * 3/2001 Jones et al.
6,517,417 B2 * 2/2003 Duggal et al.

* cited by examiner

*Primary Examiner*—Geoffrey S. Evans
(74) *Attorney, Agent, or Firm*—Bazerman & Drangel, PC

(57) ABSTRACT

The present invention is directed to an apparatus and method of solder-sealing an active matrix OLED display using a monochromatic solid-state laser beam (1). The solder-sealing apparatus comprises a cover assembly (13) adapted to be positioned over at least one OLED (11) on a substrate (10), a sealing band (12) surrounding each OLED, a chuck assembly (20) with an array of heat sinks (21) that align with the OLEDs, a pick-up assembly (30) with at least one aperture (33), and a flange assembly (132) to which a solder pre-form (133) is secured. The chuck assembly (20) receives, aligns and orients the substrate (10). A vacuum is then applied through each aperture (33) to align and hold the cover assembly (13) in place. The sealing band (12) and solder pre-form (133) are aligned and pressed together by the pick-up assembly (30), and the focused laser beam (1) is projected through the chuck assembly to seal the OLEDs (11) within the cover assembly (13).

56 Claims, 5 Drawing Sheets

APPARATUS AND METHOD FOR SOLDER-SEALING AN ACTIVE MATRIX ORGANIC LIGHT EMITTING DIODE

CROSS-REFERENCE TO RELATED APPLICATIONS

This application relates to and claims priority on U.S. Provisional Application Ser. No. 60/181,070, filed Feb. 8, 2000 and entitled "Method of Solder-Sealing Active Matrix Organic Light Emitting Diode."

FIELD OF THE INVENTION

The present invention relates generally to the sealing of organic light emitting diode (OLED) devices. In particular, the present invention is directed to an apparatus and method of solder-sealing an active matrix OLED display.

BACKGROUND OF THE INVENTION

An OLED is a thin film structure formed on a substrate. A light emitting layer of a luminescent organic solid, as well as adjacent semiconductor layers, are sandwiched between a cathode and an anode. The semiconductor layers may be either hole-injecting or electron-injecting layers. The light emitting layer may consist of multiple sublayers. When a potential difference is applied across the device, negatively charged electrons move from the cathode to the electron-injecting layer and finally into the layer(s) of organic material. At the same time, positive charges, typically referred to as holes, move from the anode to the hole-injection layer and finally into the same light emitting organic layer. When the positive and negative charges meet in the organic material layer(s), they recombine and produce photons.

In a typical matrix-addressed OLED display, numerous OLEDs are formed on a single substrate and arranged in groups in a grid pattern. Several OLED groups forming a column of the grid may share a common cathode, or cathode line. Several OLED groups forming a row of the grid may share a common anode, or anode line. The individual OLEDs in a given group emit light when their cathode line and anode line are activated at the same time.

OLEDs have a number of beneficial characteristics. These characteristics include a low activation voltage, fast response when formed with a thin light emitting layer, and high brightness in proportion to the injected electric current. Depending on the composition of the organic material making up the light emitting layer, many different colors of light may be produced, ranging from visible blue, to green, yellow and red.

OLEDs, however, are susceptible to damage resulting from exposure to the atmosphere. The fluorescent organic material in the light emitting layer can be reactive. Exposure to moisture and oxygen may cause a reduction in the useful life of the light emitting device. OLEDs are extremely sensitive to moisture. Their performance rapidly degrades in the presence of a minute amount of moisture. The organic materials are susceptible to reacting with constituents of the atmosphere such as water and oxygen. Additionally, the materials that typically comprise the cathode and anode may react with oxygen and may be negatively affected by oxidation.

One disadvantage of oxygen and moisture penetration into the interior of the OLED is the potential to form metal oxide impurities at the metal-organic material interface. In a matrix addressed OLED, these metal oxide impurities may cause separation of the cathode or anode from the organic material. Oxidation sensitive cathode materials such as Mg—Ag or Al—Li are especially susceptible. The result may be dark, non-emitting spots at the areas of separation due to a lack of current flow.

Edge shorting between the cathode and anode layers is a further problem affecting most conventional OLED devices. Edge shorting reduces the illumination potential of the display devices. For the reasons set forth above, exposing a conventional OLED to the atmosphere shortens its life. To obtain a practical, useable OLED device, it is necessary to protect or seal the device, so that water, oxygen, etc., do not infiltrate the light emitting layer or oxidize the electrodes.

Methods commonly employed for protecting or sealing inorganic electroluminescent devices are typically not effective for sealing OLEDs. Resin coatings have been used to protect inorganic electroluminescent devices, but are not suited for OLEDs. The solvent used in the resin coating solution tends to infiltrate the light emitting layer, degrading the light emission properties of the device.

U.S. Pat. No. 5,505,985 to Nakamura et al. (Nakamura), discloses a process for depositing a film comprising an electrically insulating polymer as a protective layer on an outer surface of an organic electroluminescent device. Nakamura asserts that the polymers disclosed protect the device and have excellent electrical resistivity, breakdown strength and moisture resistance, while at the same time are transparent to emitted light. Nakamura also teaches that, when deposited by a physical vapor deposition (PVD) method, the protective layer formed by the polymer compound is pinhole free. The sealing method taught by Nakamura, however, yields a moisture diffusivity too high to be useful for reliable OLEDs. Moisture levels as low as 1 ppm may damage an OLED.

Others have tried evaporated metal films to seal an OLED. However, to avoid pinholes, these films must be relatively thick, resulting in poor light transmission.

Hermetic sealings for OLEDs are the key to better performance. An epoxy-based sealing process, however, is not desirable because moisture permeation through the epoxy is significant. A metal seal process is the best solution to the problem. Although metal sealing provides the necessary hermeticity, the actual process of sealing, using a suitable solder material, poses many problems. The most significant problem is that of heating the substrate that contains the OLEDs during the sealing process. Since the OLEDs can not withstand exposure to more than about 120° C., it is difficult to obtain a good seal at such a temperature. A more rugged seal requires higher temperatures.

In the case of monochrome OLEDs, the sealing process may be achieved by seam sealing. The use of a metal flange with a clear glass window provides a good sealing process. However, in the case of color OLED devices, the window-glass consists of patterned color filters or color changing media material (CCM). These color patterns need to be precisely aligned with the OLED device on the silicon substrate and then sealed. Seam sealing does not lend itself to such precise boding accuracy. Thermal sealing, using a thermal head, can also be used. However, the heat generated during the seal is too high.

In the present invention, Applicants use a focused light beam, such as a laser beam, to provide an efficient and practical way to seal color OLEDs. The innovative sealing process of the present invention is efficient in thermal budget, uniform in applying pressure and provides a high packing density of the device per silicon wafer. To prevent heat damage, a glass chuck is used to position an array of inverted heat sinks, so that each OLED is aligned with an individual heat sink.

OBJECTS OF THE INVENTION

It is therefore an object of the present invention to provide an efficient process for sealing an OLED.

It is another object of the present invention to provide a rugged seal for an OLED.

It is still another object of the present invention to provide an apparatus for sealing an OLED.

It is yet another object of the present invention to provide an apparatus for sealing an OLED utilizing a solid state laser.

It is a further object of the present invention to provide an apparatus for orienting an OLED and seal assembly having high alignment accuracy.

Additional objects and advantages of the invention are set forth, in part in the description which follows and, in part, will be apparent to one of ordinary skill in the art from the description and/or from the practice of the invention.

SUMMARY OF THE INVENTION

In response to the foregoing challenge, Applicants have developed an innovative, efficient and rugged sealing assembly for sealing an OLED device on a substrate. The sealing assembly includes a cover assembly adapted to be positioned over the OLED device. The cover assembly includes a periphery. The cover assembly further includes a securing assembly for securing the cover assembly to the substrate. The securing assembly is located about the periphery of the cover assembly. The sealing assembly further includes an attachment assembly for attaching the securing assembly to the substrate. The attachment assembly is located on the substrate.

In accordance with the present invention, the cover assembly may include a transparent face plate. The face plate is adapted to be located above the organic light emitting diode device. The face plate further includes a flange assembly secured about the periphery of the face plate. In accordance with the present invention, the attachment assembly extends about and is spaced from the outer periphery of the OLED on the substrate. The attachment assembly includes at least one sealing band extending about the outer periphery. The securing assembly may comprise a solder pre-form.

The present invention is also directed to a sealing apparatus for sealing at least one OLED device located on a substrate with at least one cover assembly. The sealing apparatus may comprising a substrate holding assembly for holding the substrate having at least one OLED device thereon on during a sealing procedure. The sealing apparatus may further include a cover assembly holding assembly for holding and positioning the at least one cover assembly over the substrate during a sealing process. The sealing apparatus also includes an energy supply assembly for supplying energy to seal the at least one cover assembly to the substrate. The energy supply assembly includes a laser beam. The energy supply assembly directs the laser beam through the substrate holding assembly during the sealing process.

In accordance with the present invention, the substrate holding assembly includes at least one heat sink assembly. The at least one heat sink assembly may be positioned adjacent to the at least one OLED device on the substrate. The cover assembly holding assembly includes at least one vacuum assembly for holding the at least one cover assembly during the sealing process. The cover holding assembly may further include at least one cover heat sink assembly.

The present invention is also directed to a method of sealing an organic light emitting diode device on a substrate. The method includes the steps of providing a substrate having at least one organic light emitting diode device thereon, wherein each of the at least one organic light emitting diode device having an outer periphery, wherein the substrate having at least one sealing band spaced from and extending about the outer periphery, and providing at least one cover assembly having a cover outer periphery having a sealing component thereon. The method further includes the steps of aligning the cover outer periphery of the at least one cover assembly with the at least one sealing band, applying an energy source to the at least one sealing band and the sealing component, and applying pressure between the at least one sealing band and the sealing component to secure the at least one cover assembly to the substrate. In this process, the substrate, which is preferably a wafer containing a plurality of OLEDs is loaded on a glass chuck with an array of inserted heat sinks. The substrate wafer and the chuck are aligned so that each OLED located on substrate is aligned with an individual heat sink. The cover assembly for individual OLEDs are mounted on the pick-up head with heat sinks and held by vacuum suction.

High resolution alignment between the cover assembly and the device can be achieved by picking up a single cover assembly and aligning the cover assembly with an individual OLED device and then applying the required pressure uniformly. The same light source can be used to tag the parts and secure the alignment. After the alignment, the scanning light beam can be scanned in the seal band pattern and seal the parts. This process will have extremely high alignment accuracy. With today's available optical alignment tool, the seal can be made for a half micron (0.5 $\mu$m) alignment accuracy. This will solve the miniature color display sealing problem.

Thus, in one embodiment, the present invention relates to an apparatus for sealing at least one organic light emitting diode device located on a substrate with at least one cover assembly, the apparatus comprising (a) a chuck assembly for receiving the substrate, wherein the chuck assembly comprises at least one heat sink aligned with the at least one organic light emitting diode device and wherein the at least one organic light emitting diode device is surrounded by a first sealing band and a second sealing band located on the substrate and separated by a gap, wherein the first sealing band is closer to the at least one organic light emitting diode device than the second sealing band; (b) a pick-up assembly for receiving the at least one cover assembly, comprising (i) a base assembly having a bottom surface and a top surface, each of which is parallel to the substrate in the chuck assembly, the base assembly comprising (1) at least one recess in the bottom surface for receiving the at least one cover assembly, (2) at least one aperture through the base assembly from the at least one recess to the top surface through which a vacuum is applied to hold the at least one cover assembly in the at least one recess, and (3) at least one heat sink on the top surface, wherein the at least one cover assembly comprises a face plate having a periphery and a flange assembly around the periphery, the flange assembly having a first portion that is secured to the face plate, a second portion having secured thereto a solder pre-form that is aligned with the first sealing band on the substrate, and an intermediate portion connecting the first and second portions; and (ii) a means for applying pressure to the aligned solder pre-form and first sealing band; and (c) a laser beam projected through the chuck assembly.

In another embodiment, the present invention relates to a method for sealing at least one organic light emitting diode device located on a substrate with at least one cover assembly, the method comprising (a) providing the substrate in a chuck assembly, wherein the chuck assembly comprises at least one heat sink aligned with the at least one organic light emitting diode device and wherein the at least one organic light emitting diode device is surrounded by a first sealing band and a second sealing band located on the substrate, wherein the first sealing band and the second sealing band are separated by a gap and the first sealing band is closer to the at least one organic light emitting diode device than the second sealing band; (b) providing at least one cover assembly in a pick-up assembly, the pick-up assembly comprising (i) a base assembly having a bottom surface and a top surface, each of which is parallel to the substrate in the chuck assembly, the base assembly comprising (1) at least one recess in the bottom surface for receiving the at least one cover assembly, (2) at least one aperture through the base assembly from the at least one recess to the top surface through which a vacuum is applied to hold the at least one cover assembly in the at least one recess, and (3) at least one heat sink on the top surface, wherein the at least one cover assembly comprises a face plate having a periphery and a flange assembly around the periphery, the flange assembly having a first portion that is secured to the face plate, a second portion having secured thereto a solder pre-form that is aligned with the first sealing band on the substrate, and an intermediate portion connecting the first and second portions; and (ii) a means for applying pressure to the aligned solder pre-form and first sealing band; (c) aligning the solder pre-form with the first sealing band; (d) contacting the solder pre-form and the first sealing band; (e) applying heat to the solder pre-form and the first sealing band; and (f) applying pressure to the aligned and contacted solder pre-form and first sealing band.

In yet another embodiment, the present invention relates to a method for sealing at least one organic light emitting diode device located on a substrate with at least one cover assembly, the method comprising (a) applying a laser beam through a chuck assembly, wherein the substrate is in the chuck assembly, wherein the chuck assembly comprises at least one heat sink aligned with the at least one organic light emitting diode device and wherein the at least one organic light emitting diode device is surrounded by a first sealing band and a second sealing band located on the substrate, wherein the first sealing band and the second sealing band are separated by a gap and the first sealing band is closer to the at least one organic light emitting diode device than the second sealing band; and (b) applying pressure to a solder pre-form in the at least one cover assembly that is aligned with the first sealing band located on the substrate such that the solder pre-form contacts the first sealing band, wherein the at least one cover assembly comprises a face plate having a periphery and a flange assembly around the periphery, the flange assembly having a first portion that is secured to the face plate, a second portion having secured thereto the solder pre-form, and an intermediate portion connecting the first and second portions; and wherein the at least one cover assembly is in a pick-up assembly, the pick-up assembly comprising (i) a base assembly having a bottom surface and a top surface, each of which is parallel to the substrate in the chuck assembly, the base assembly comprising (1) at least one recess in the bottom surface for receiving the at least one cover assembly, (2) at least one aperture through the base assembly from the at least one recess to the top surface through which a vacuum is applied to hold the at least one cover assembly in the at least one recess, and (3) at least one heat sink on the top surface; and (ii) a means for applying pressure to the aligned and contacted solder pre-form and first sealing band."

BRIEF DESCRIPTION OF THE DRAWINGS

The invention will now be described in conjunction with the following drawings in which like reference numerals designate like elements and wherein.

DETAILED DESCRIPTION OF PREFERRED EMBODIMENTS

Figure 1:
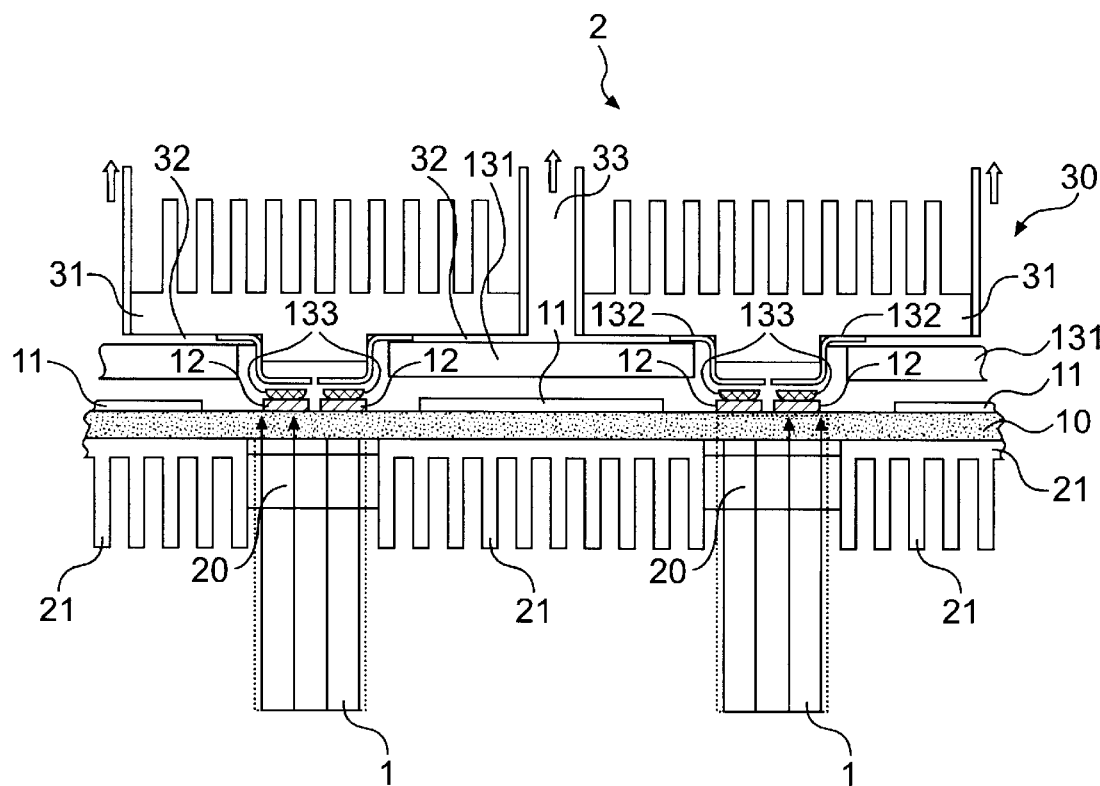
FIG. 1 is a schematic view of a sealing assembly for an OLED according to an embodiment of the present invention and an apparatus for sealing the same.
Figure 2:
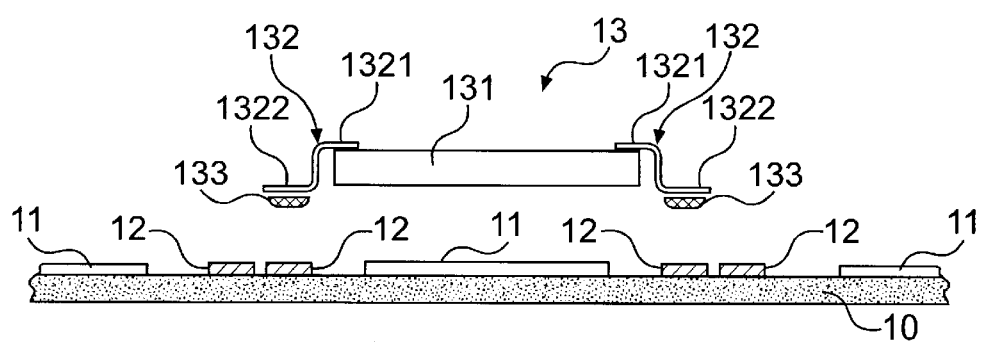
FIG. 2 is a schematic view of the sealing assembly for the OLED of FIG. 1.
Figure 3:
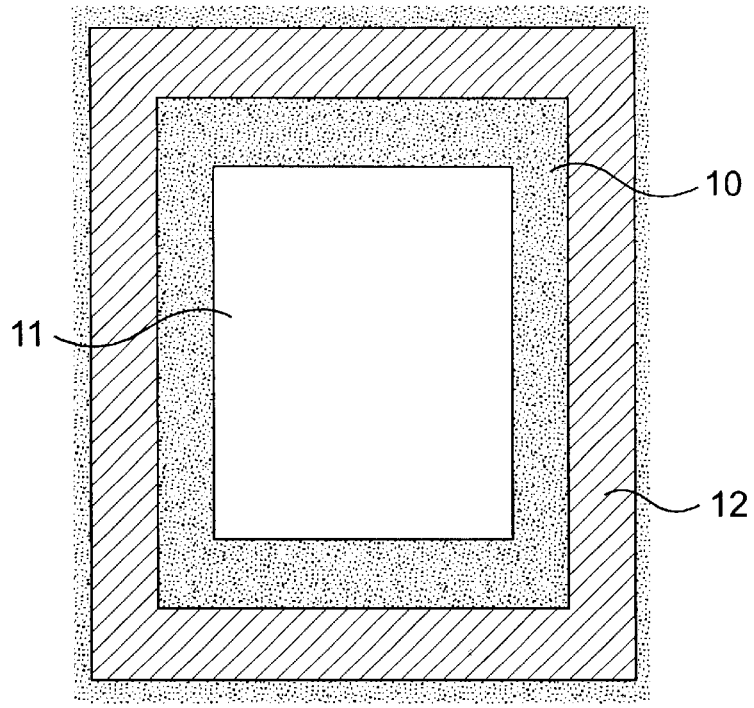
FIG. 3 is a top view of the OLED device and sealing band of the sealing assembly according to an embodiment of the present invention.
Figure 4:
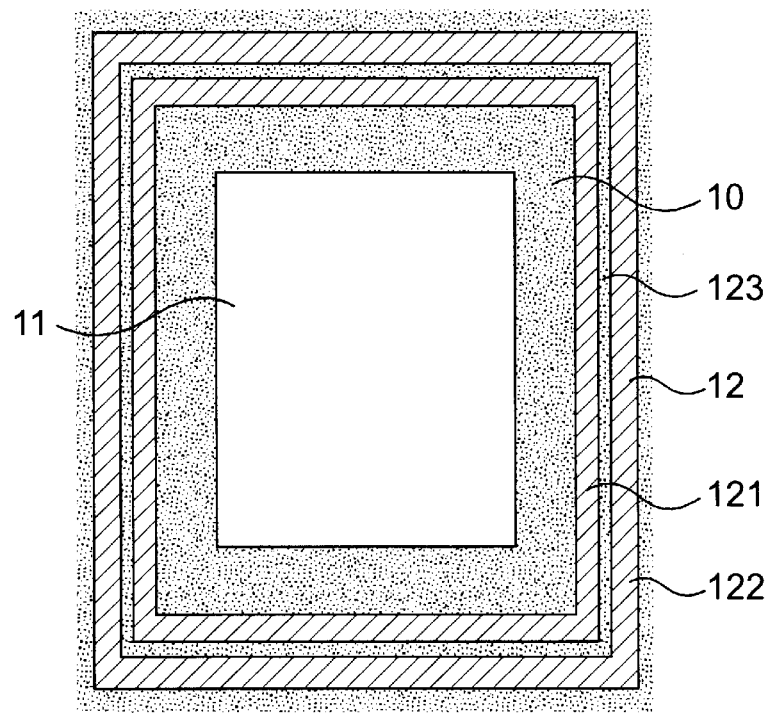
FIG. 4 is a top view of the OLED device and sealing band of the sealing assembly according to another embodiment of the present invention.

Reference will now be made in detail to preferred embodiments of the present invention, examples of which are illustrated in the accompanying drawings. In accordance with the present invention, a substrate 10 includes at least one OLED 11 formed thereon, as shown in FIGS. 1 and 2. A sealing band 12 surrounds each OLED 11, as shown in FIG. 3. In a preferred form, the sealing band 12 includes a pair of sealing bands 121 and 122 that are separated by a gap 123, as shown in FIG. 4. This configuration is preferred because of its superior sealing properties. The ratio between the width of each band 121 and 122 and the gap 123, which is determined by the optimization of the re-flow of the solder pre-form 133 and its seal band bonding.

Figure 10:
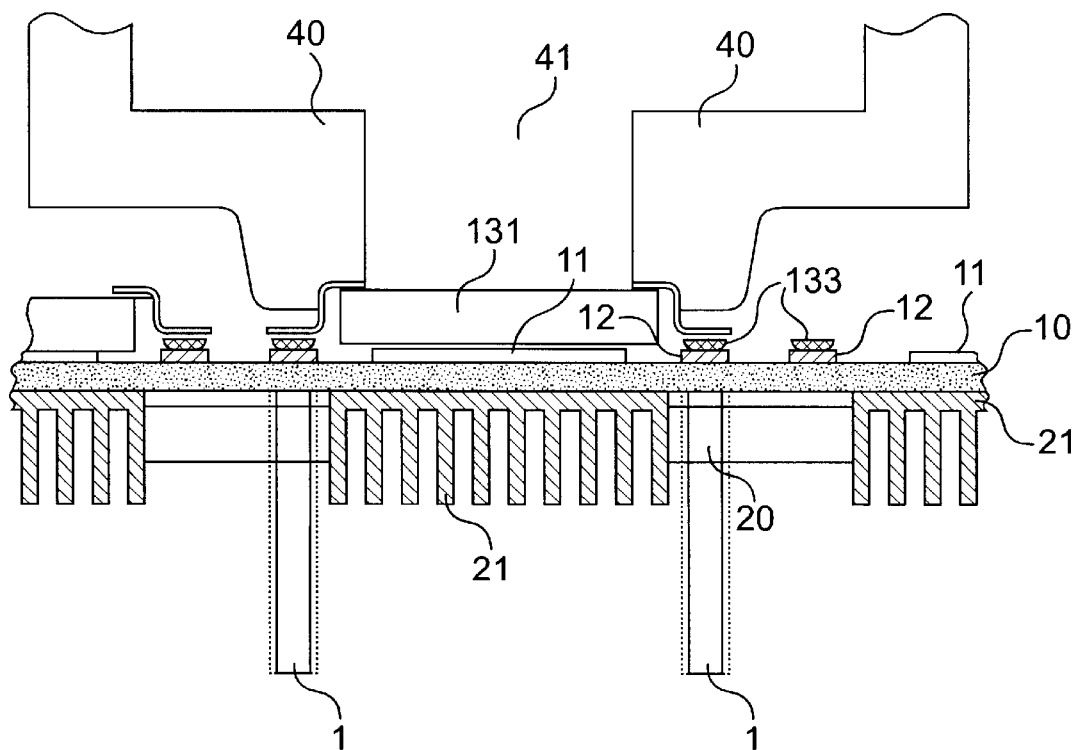
FIG. 10 is a schematic view of a sealing assembly for an OLED and an apparatus for sealing the same according to another embodiment of the present invention.

The OLED 11 is sealed using a cover assembly 13. The cover assembly 13 includes a face plate 131, preferably formed from glass. It is contemplated, however, by the present inventors that other suitable materials which are capable of transmitting light and excluding moisture and oxygen may be used to form the face plate 131. A flange assembly 132 extends around the periphery of the face plate 131. The flange assembly 132 is preferably formed from metal. The flange assembly 132 includes a portion 1321 that is secured to the face plate 131 and another portion 1322 that overlies the sealing band 12, as shown in FIGS. 1, 2, and 10.

The portion 1322 of the flange assembly 132 includes a solder pre-form 133 secured thereto. The solder pre-form 133 is adapted to overlie the sealing band 12. The solder pre-form 133 when heated secures the cover assembly 13 to the sealing band 12 on the substrate 10, which encapsulates the OLED 11. Thus, protecting the OLED 11 from moisture and contaminants.

Figure 5:
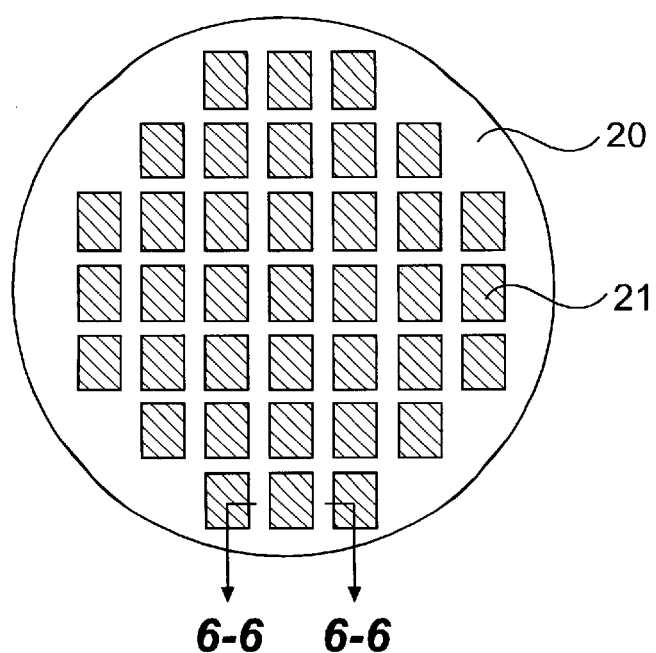
FIG. 5 is a top view of a chuck assembly for the sealing apparatus according to present invention.
Figure 6:
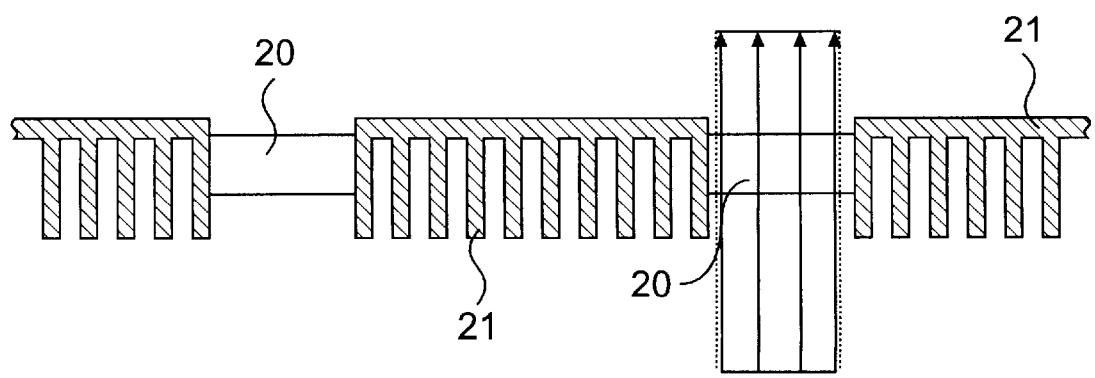
FIG. 6 is a cross sectional view of the chuck assembly of FIG. 5 along section lines 6—6.
Figure 7:
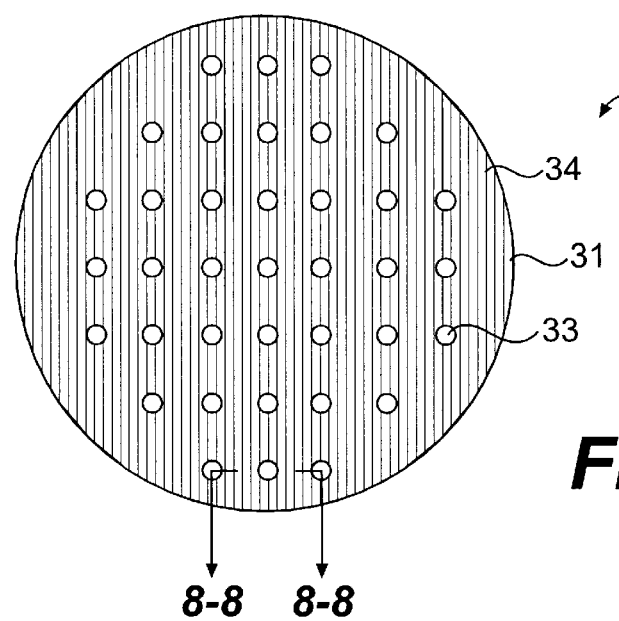
FIG. 7 is a top view of a pick-up assembly for the sealing apparatus according to present invention.

The apparatus 2 for sealing the OLED 11 will now be described. The apparatus 2 includes a chuck assembly 20 adapted for receiving the substrate 10 containing at least one OLED 11. The chuck assembly 20 is preferably formed from a transparent material, such as glass. The chuck assembly 20 may include an alignment assembly, not shown, to properly align and orient the substrate 10 containing the OLEDs 11 on the chuck assembly 20. The chuck assembly 20 further includes an array of heat sinks 21 located therein, as shown in FIGS. 5 and 6. Each heat sink 21 is preferably formed from a metallic material and aligned with an OLED 11 on substrate 10, as shown in FIGS. 1 and 10. Each heat sink 21 is sized such that it is greater in size than the outer perimeter of the OLED 11 but smaller than the inner perimeter of the band 12.

Figure 8:
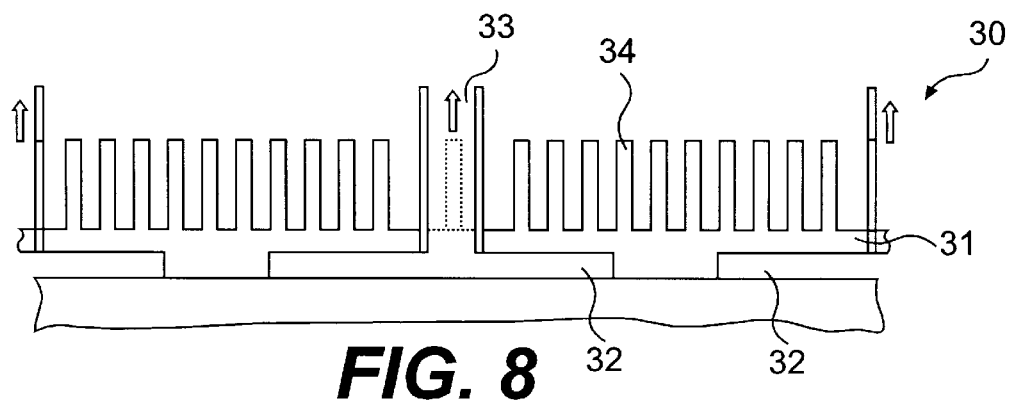
FIG. 8 is a cross sectional view of the pick-up assembly of FIG. 7 along section lines 8—8.
Figure 9:
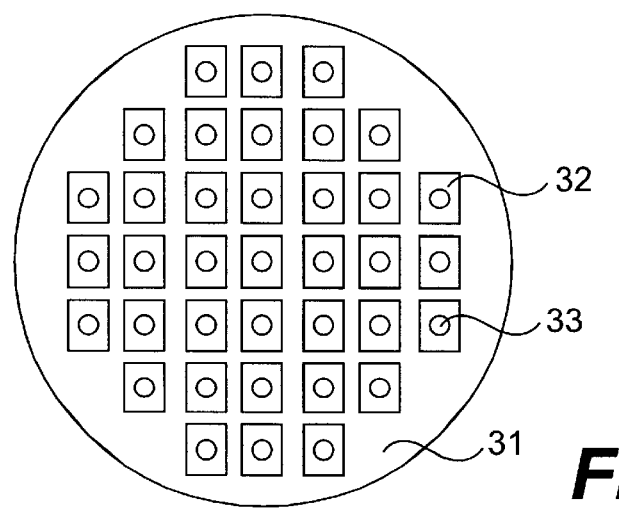
FIG. 9 is a bottom view of the pick-up assembly of FIG. 7.

The apparatus 2 also includes a pick-up assembly 30, as shown in FIGS. 1 and 7–9. The pick-up assembly 30 comprises a base assembly 31. A plurality of recesses 32 are located on one side of the base assembly 31. Each recess 32 is sized to receive a cover assembly 13, described above. The plurality of recesses 32 are aligned with the OLEDs 11 on the substrate 10. The base assembly 31 includes a plurality of apertures 33. At least one aperture 33 is located in each recess 32, as shown in FIGS. 8 and 9. A vacuum is applied through each aperture 33 to ensure that the cover assemblies 13 located with the recesses 32 are properly aligned and held within the recess 32. A plurality of fins 34 extend from the rear surface of the base assembly 31, as shown in FIGS. 1 and 8. The plurality of fins 34 function as heat sinks to control the dissipation of heat during the soldering process. The base assembly 30 is preferably formed from a material having suitable properties to function as a heat sink. The pick-up assembly 30 further functions to control the pressure applied between the solder pre-form 133 and the sealing band 12 during the sealing process. The means for controlling the pressure applied between the solder pre-form and the sealing band during the sealing process includes, but is not limited to a hydraulic means, a pneumatic means, gravity, a spring, a lever, and a screw.

FIG. 10 illustrates another embodiment of the pick-up assembly 40 in accordance with the present invention. The pick-up assembly 40 is for use in connection with the sealing of the cover assembly 130 to the substrate 10 when high accuracy alignment is required. Like the pick-up assembly 30, the pick-up assembly 40 utilizes a vacuum through opening 41 to hold the cover assembly 130 in place during the sealing operation. The pick-up assembly 40 includes a recess 42 that is sized to receive the cover assembly 13 with very close tolerances to prevent shifting of the cover assembly 130 within the recess 42 during the sealing operation. The pick-up assembly 40 further differs from the pick-up assembly 30 because it picks up and aligns a single cover assembly 130 during the sealing operation.

Figure 11:
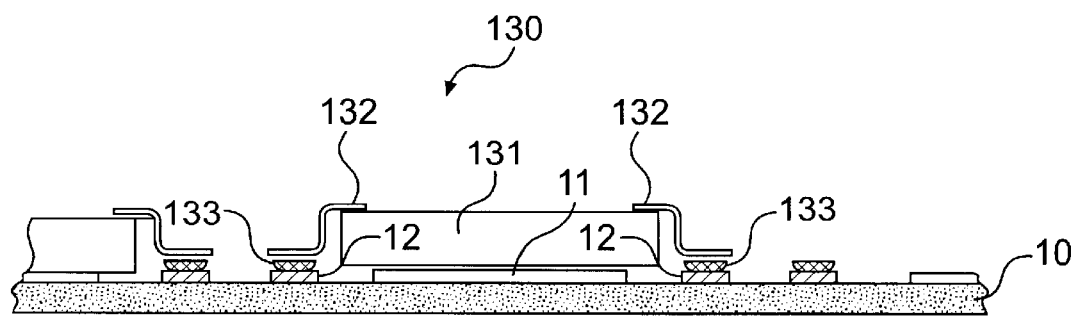
FIG. 11 is a schematic view of sealing assembly illustrated in FIG. 10 after the sealing process.

The cover assembly 130 also differs from the cover assembly 13, described above, in the gap between the cover assembly 130 and the OLED 11 is greatly reduced such that the cover assembly 130 is in contact with the OLED 11 after the sealing process is complete, as shown in FIG. 11. This arrangement minimizes color cross-talk.

The sealing process will now be described. The substrate 10 containing the OLEDs 11 is placed on the chuck assembly 20 such that each OLED 11 is aligned with the heat sink 21, as shown in FIG. 1. The cover assemblies 13 corresponding to the individual OLEDs 11 are placed on the pick-up assembly 30 and held in place by vacuum. The pick-up assembly 30 is aligned with the chuck assembly 20 such that the solder pre-form 133 is aligned with the sealing band 12, as such the face plate 131 is positioned over the OLED 11. The solder pre-form 133 is placed in contact with the sealing band 12. The pick-up assembly 30 applies a suitable uniform pressure between the cover assembly 13 and the substrate 10 to form the desired seal, when the focused laser beam 1 is projected through the chuck assembly 20, as shown in FIG. 1. In particular, uniform pressure is applied between the sealing band 12 and the flange assembly 132.

The laser beam 1 is preferably a solid state laser having a wavelength longer than the wavelength determined by the band gap of the silicon substrate. For better control of the sealing process, a pulse laser is preferred. The theoretical value of the band gap is 1.1 eV, which is equivalent to 1.24 micrometers. Depending upon impurity and defects levels, the effective band gap may be slightly smaller, nevertheless a wavelength greater than 1.3 micrometers will be transmitted more than 90% through the silicon substrate 10. The laser beam 1 should also be monochromatic.

A scanning point light source (i.e., the laser beam 1) is aimed at the seal band 12 from the backside of the substrate 10 through chuck assembly 20. As discussed above, there is a small gap 123 that divides the sealing band 12 into two co-axis sub-frames 121 and 122. The gap 123 allows a portion of the light to directly hit the solder pre-form 133 to bring it to a re-flow condition. The light blocked by the sealing bands 121 and 122 heats up the seal band to a temperature that enables good wetting of the solder on the band 12. The dimension of the gap will be determined by the ratio of the required amount of heat to elevate the solder pre-form 133 and the sealing band 12 to their desired temperatures.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An apparatus for sealing at least one organic light emitting diode device located on a substrate with at least one cover assembly, said apparatus comprising:

(a) a chuck assembly for receiving said substrate, wherein said chuck assembly comprises at least one heat sink aligned with said at least one organic light emitting diode device and wherein said at least one organic light emitting diode device is surrounded by a first sealing band and a second sealing band located on said substrate and separated by a gap, wherein said first sealing band is closer to said at least one organic light emitting diode device than said second sealing band;

(b) a pick-up assembly for receiving said at least one cover assembly, comprising:

(i) a base assembly having a bottom surface and a top surface, each of which is parallel to said substrate in said chuck assembly, said base assembly comprising (1) at least one recess in said bottom surface for receiving said at least one cover assembly, (2) at least one aperture through said base assembly from said at least one recess to said top surface through which a vacuum is applied to hold said at least one cover assembly in said at least one recess, and (3) at least one heat sink on said top surface, wherein said at least one cover assembly comprises a face plate having a periphery and a flange assembly around said periphery, said flange assembly having a first portion that is secured to the face plate, a second portion having secured thereto a solder pre-form that is aligned with said first sealing band on said substrate, and an intermediate portion connecting said first and second portions; and (ii) a means for applying pressure to said aligned solder pre-form and first sealing band; and (c) a laser beam projected through said chuck assembly.

2. The apparatus of claim 1, wherein said pick-up assembly includes at least one vacuum assembly for holding said at least one cover assembly in said at least one recess.

3. The apparatus of claim 1, wherein said chuck assembly is formed from a transparent material.

4. The apparatus of claim 3, wherein said transparent material is glass.

5. The apparatus of claim 1, wherein said chuck assembly further comprises an alignment assembly for aligning said substrate on said chuck assembly.

6. The apparatus of claim 5, wherein said aligning is accomplished using said laser beam projected through said chuck assembly.

7. The apparatus of claim 1, wherein said at least one heat sink on said chuck assembly has a diameter, said at least one organic light emitting diode device has a diameter, and said area of the substrate surrounding said at least one organic light emitting diode device and delineated by said first sealing band has a diameter, and wherein said diameter of said at least one heat sink is larger than said diameter of said at least one organic light emitting diode device and smaller than said diameter of said area of the substrate surrounding said at least one organic light emitting diode device and delineated by said first sealing band.

8. The apparatus of claim 1, wherein said at least one heat sink on said chuck assembly and said at least one heat sink on said pick-up assembly are formed from a metallic material.

9. The apparatus of claim 1, wherein said face plate of said cover assembly is formed from glass.

10. The apparatus of claim 1, wherein said flange assembly around the periphery of said face plate is formed from a metallic material.

11. The apparatus of claim 1, wherein said laser beam has a wavelength that is greater than 1.3 micrometers.

12. The apparatus of claim 1, wherein said laser beam is monochromatic.

13. The apparatus of claim 1, wherein said face plate of said at least one cover assembly is in contact with said at least one organic light emitting diode device after sealing.

14. The apparatus of claim 1, wherein said pressure is uniform pressure.

15. The apparatus of claim 1, wherein said means for applying said pressure is selected from the group consisting of a hydraulic means, a pneumatic means, gravity, a spring, a lever, and a screw.

16. A method for sealing at least one organic light emitting diode device located on a substrate with at least one cover assembly, said method comprising the steps of:

(a) providing said substrate in a chuck assembly, wherein said chuck assembly comprises at least one heat sink aligned with said at least one organic light emitting diode device and wherein said at least one organic light emitting diode device is surrounded by a first sealing band and a second sealing band located on said substrate, wherein said first sealing band and said second sealing band are separated by a gap and said first sealing band is closer to said at least one organic light emitting diode device than said second sealing band;

(b) providing at least one cover assembly in a pick-up assembly, said pick-up assembly comprising:

(i) a base assembly having a bottom surface and a top surface, each of which is parallel to said substrate in said chuck assembly, said base assembly comprising:

(1) at least one recess in said bottom surface for receiving said at least one cover assembly, (2) at least one aperture through said base assembly from said at least one recess to said top surface through which a vacuum is applied to hold said at least one cover assembly in said at least one recess, and (3) at least one heat sink on said top surface, wherein said at least one cover assembly comprises a face plate having a periphery and a flange assembly around said periphery, said flange assembly having a first portion that is secured to the face plate, a second portion having secured thereto a solder pre-form that is aligned with said first sealing band on said substrate, and an intermediate portion connecting said first and second portions; and (ii) a means for applying pressure to said aligned solder pre-form and first sealing band;

(c) aligning said solder pre-form with said first sealing band;

(d) contacting said solder pre-form and said first sealing band;

(e) applying heat to said solder pre-form and said first sealing band; and (f) applying pressure to said aligned and contacted solder pre-form and first sealing band.

17. The method of claim 16, wherein said heat is applied through said chuck assembly.

18. The method of claim 17, wherein said heat is applied using a laser beam.

19. The method of claim 18, wherein said laser beam has a wavelength that is greater than 1.3 micrometers.

20. The method of claim 18, wherein said laser beam is monochromatic.

21. The method of claim 16, wherein said pick-up assembly includes at least one vacuum assembly for holding said at least one cover assembly in said at least one recess.

22. The method of claim 16, wherein said pressure is applied by a means selected from the group consisting of a hydraulic means, a pneumatic means, gravity, a spring, a lever, and a screw.

23. The method of claim 16, wherein steps (e) and (f) are performed simultaneously.

24. The method of claim 16, wherein said chuck assembly further comprises an alignment assembly for aligning said substrate on said chuck assembly.

25. The method of claim 16, wherein said aligning step is accomplished using a laser beam projected through said chuck assembly.

26. The method of claim 25, wherein the heat is applied using said laser beam.

27. The method of claim 25, wherein said laser beam has a wavelength that is greater than 1.3 micrometers.

28. The method of claim 25, wherein said laser beam is monochromatic.

29. The method of claim 26, wherein said laser beam has a wavelength that is greater than 1.3 micrometers.

30. The method of claim 26, wherein said laser beam is monochromatic.

31. The method of claim 16, wherein said at least one heat sink on said chuck assembly has a diameter, said at least one organic light emitting diode device has a diameter, and said area of the substrate surrounding said at least one organic light emitting diode device and delineated by said first sealing band has a diameter, and wherein said diameter of said at least one heat sink is larger than said diameter of said at least one organic light emitting diode device and smaller than said diameter of said area of the substrate surrounding said at least one organic light emitting diode device and delineated by said first sealing band.

32. The method of claim 16, wherein said at least one heat sink on said chuck assembly and said at least one heat sink on said pick-up assembly are formed from a metallic material.

33. The method of claim 16, wherein said face plate of said cover assembly is formed from glass.

34. The method of claim 16, wherein said flange assembly around the periphery of said face plate is formed from a metallic material.

35. The method of claim 16, wherein said face plate of said at least one cover assembly is in contact with said at least one organic light emitting diode device after sealing.

36. The method of claim 16 wherein said pressure is uniform pressure.

37. The method of claim 16, wherein said chuck assembly is formed from a transparent material.

38. The method of claim 22, wherein said transparent material is glass.

39. The method of claim 37, wherein said aligning is accomplished using said laser beam projected through said chuck assembly.

40. The method of claim 39, wherein said laser beam has a wavelength that is greater than 1.3 micrometers.

41. The method of claim 39, wherein said laser beam is monochromatic.

42. A method for sealing at least one organic light emitting diode device located on a substrate with at least one cover assembly, said method comprising:
(a) applying a laser beam through a chuck assembly, wherein said substrate is in said chuck assembly, wherein said chuck assembly comprises at least one heat sink aligned with said at least one organic light emitting diode device and wherein said at least one organic light emitting diode device is surrounded by a first sealing band and a second sealing band located on said substrate, wherein said first sealing band and said second sealing band are separated by a gap and said first sealing band is closer to said at least one organic light emitting diode device than said second sealing band; and
(b) applying pressure to a solder pre-form in said at least one cover assembly that is aligned with said first sealing band located on said substrate such that said solder pre-form contacts said first sealing band, wherein said at least one cover assembly comprises a face plate having a periphery and a flange assembly around said periphery, said flange assembly having a first portion that is secured to the face plate, a second portion having secured thereto said solder pre-form, and an intermediate portion connecting said first and second portions; and wherein said at least one cover assembly is in a pick-up assembly, said pick-up assembly comprising
(i) a base assembly having a bottom surface and a top surface, each of which is parallel to said substrate in said chuck assembly, said base assembly comprising:
(1) at least one recess in said bottom surface for receiving said at least one cover assembly,
(2) at least one aperture through said base assembly from said at least one recess to said top surface through which a vacuum is applied to hold said at least one cover assembly in said at least one recess, and
(3) at least one heat sink on said top surface; and
(ii) a means for applying pressure to said aligned and contacted solder pre-form and first sealing band.

43. The method of claim 42, wherein said laser beam has a wavelength that is greater than 1.3 micrometers.

44. The method of claim 42, wherein said laser beam is monochromatic.

45. The method of claim 42, wherein said pick-up assembly includes at least one vacuum assembly for holding said at least one cover assembly in said at least one recess.

46. The method of claim 42, wherein said chuck assembly is formed from a transparent material.

47. The method of claim 46, wherein said transparent material is glass.

48. The method of claim 42, wherein said chuck assembly further comprises an alignment assembly for aligning said substrate on said chuck assembly.

49. The method of claim 42, wherein said at least one heat sink on said chuck assembly has a diameter, said at least one organic light emitting diode device has a diameter, and said area of the substrate surrounding said at least one organic light emitting diode device and delineated by said first sealing band has a diameter, and wherein said diameter of said at least one heat sink is larger than said diameter of said at least one organic light emitting diode device and smaller than said diameter of said area of the substrate surrounding said at least one organic light emitting diode device and delineated by said first sealing band.

50. The method of claim 42, wherein said at least one heat sink on said chuck assembly and said at least one heat sink on said pick-up assembly are formed from a metallic material.

51. The method of claim 42, wherein said face plate of said cover assembly is formed from glass.

52. The method of claim 42, wherein said flange assembly around the periphery of said face plate is formed from a metallic material.

53. The method of claim 42, wherein said face plate of said at least one cover assembly is in contact with said at least one organic light emitting diode device after sealing.

54. The method of claim 42 wherein said pressure is uniform pressure.

55. The method of claim 42, wherein said pressure is applied by a means selected from the group consisting of a hydraulic means, a pneumatic means, gravity, a spring, a lever, and a screw.

56. The method of claim 42, wherein steps (a) and (b) are performed simultaneously.

* * * * *